United States Patent [19]

Kawamoto et al.

[11] Patent Number: 5,254,361
[45] Date of Patent: Oct. 19, 1993

[54] METHOD FOR PRODUCING PRINTED CIRCUIT BOARDS

[75] Inventors: Takao Kawamoto; Hitoshi Yano; Kazutsune Kikuta, all of Ichihara; Shiro Konotsune, Yokosuka, all of Japan

[73] Assignee: Chisso Corporation, Osaka, Japan

[21] Appl. No.: 826,773

[22] Filed: Feb. 13, 1992

Related U.S. Application Data

[63] Continuation of Ser. No. 556,522, Jul. 24, 1990, abandoned.

[51] Int. Cl.⁵ .............................................. B05D 5/12
[52] U.S. Cl. .................................... 427/96; 106/20 R
[58] Field of Search ....................... 427/96; 106/20 R

[56] References Cited

U.S. PATENT DOCUMENTS

| | | | |
|---|---|---|---|
| 4,073,788 | 2/1978 | Peterson | 260/29.2 |
| 4,347,306 | 8/1982 | Takeda et al. | 427/96 |
| 4,496,794 | 1/1985 | Darms et al. | 174/68.5 |
| 4,731,287 | 3/1988 | Noda et al. | 428/332 |
| 4,839,232 | 6/1989 | Morita et al. | 428/473.5 |
| 4,871,619 | 10/1989 | Araps et al. | 428/473.5 |
| 5,077,084 | 12/1991 | Konotsune | 427/96 |

Primary Examiner—Mark L. Bell
Assistant Examiner—Margaret Einsmann
Attorney, Agent, or Firm—Lowe, Price, LeBlanc & Becker

[57] ABSTRACT

A method for producing circuit boards with a film having improved printing properties, adhesion, flexibility and heat resistance which comprises applying a liquid printing ink composition comprising an admixture of a solvent, a polyamide-acid and a partially imidized polyamide-acid, then heat to effect drying and curing.

5 Claims, No Drawings

METHOD FOR PRODUCING PRINTED CIRCUIT BOARDS

This is a continuation of application Ser. No. 07/556,522, filed Jul. 24, 1990 now abandoned and the benefits of 35 USC 120 are claimed relative to it.

BACKGROUND OF THE INVENTION

1. Field of the Invention

The present invention relates to a method for applying a printing ink composition to circuit boards, and more particularly, to a method of applying printing ink composition exhibiting improved printing properties, adhesion, flexibility and heat resistance.

2. Description of Related Art

Heretofore, cover films have been used as coating materials for printed circuits. This technique is that an adhesive is coated on one surface of a polyimide or polyester film and holes are made only at portions corresponding to connection terminals by means of punching or the like and alignment of position is effected on the circuit board by handwork and then they are adhered at an elevated temperature under a high pressure by a hot plate press.

This method can give good flexibility and is excellent from the standpoint of circuit protection, but there are some problems. For example, when a lead wire is attached to a terminal of a circuit board, it is necessary to punch the cover film previously to make a small hole. Therefore, when the circuit is communicated, the position alignment with the circuit board is difficult. In addition, the investment in a hot plate press is expensive. Further, the use of an adhesive is liable to cause smearing upon munching processing and the cost becomes high and there is a fear that adhesive will ooze out.

Even if physical properties of a film itself are good, there is the possibility that the use of an adhesive will lower said physical properties.

Furthermore, the functions themselves of the adhesives still have problems, that is, an adhesive capable of adhering sufficiently to both a cover film such as polyimide film and the surface of a printed circuit and exhibiting good heat resistance and electric characteristics has not yet been found.

On the contrary, a method of forming an insulating protecting film on a printed circuit board by a printing process (cover-lay ink) has been developed. However, cover-lay ink agents used at present are based on solder resists which have been heretofore used for rigid substrates, and therefore, flexibility is less and heat resistance and electric characteristics are poor.

Japanese Patent Application Laid-open No. 145717/1980 discloses a composition composed of epoxy acrylate resin and melamine resin, but this composition has low flexibility.

Further, Japanese Patent Publication Nos. 1395/1975 and 10636/1978 propose acrylic resin compositions such as sulfomethylene acrylates, phosphoric acid ethylene acrylates and the like, but these compositions have relatively good flexibility while the heat resistance is very poor.

Heretofore, in order to use polyimide and polyamide-acid solutions as an ink for screen printing, thixotropy agents have been used to impart thixotropy thereto.

However, the conventional thixotropy agents can not sufficiently exhibit the functions due to polarity of polyamide-acids and that of solvents used for dissolving the resin, and a large amount of a thixotropy agent is used so as to exhibit sufficiently the thixotropy.

Therefore, the addition of a thixotropy agent often causes the degradation of the physical properties as a film. In addition, the adhesion of the film to the substrate is disadvantageously lowered by adding a thixotropy agent.

For example, Japanese Patent Publication No. 37073/1987 and Japanese Patent Application Laid-open Nos. 221172/1988 and 121364/1989 disclose that fine powder of silica is used as a thixotropy agent, but due to the polarity of solvents and resins, a large amount of silica powder should be used and thereby the flexibility and adhesion to a substrate are poor, Japanese Patent Application Laid-open Nos. 179242/1982, 189260/1983, and 108068/1984 disclose that polyimide powder is used as a thixotropy agent, but it is required to add polyimide powder in a large amount and thereby there are drawbacks that the resulting flexibility is poor, the surface smoothness is inferior and shrinkage upon curing is large.

The present inventors have made researches so as to find a cover-lay ink resin composition for coating which can satisfy requirements for the various functions. As a result, it has been found that a composition comprising a partially imidized polyamide-acid solution as the main component can give excellent heat resistance, flexibility, electric properties and printing properties. In particular, it has been found that the flexibility can be improved to a great extent since a thixotropy agent in the form of a solid powder is not added.

SUMMARY OF THE INVENTION

It is an object of the present invention to provide a printing ink composition exhibiting excellent heat resistance, adhesion, flexibility and electric properties.

It is another object of the present invention to provide a printing ink composition capable of being coated on a flexible copper-coated board by a screen printing method to easily form a highly reliable film.

It is a further object of the present invention to provide a printing ink composition which can form a film on a circuit board at an improved production efficiency and any expensive equipment is not required.

According to the present invention, there is provided a printing ink composition which comprises (a) a polyamide-acid (A), a partially imidized polyamide-acid (B) containing repeating unit of the following formulas (I), (II) and (III), and a solvent,

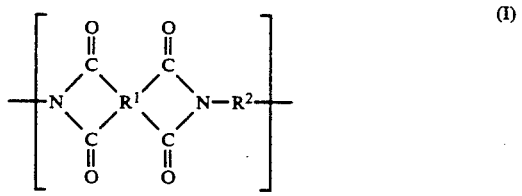

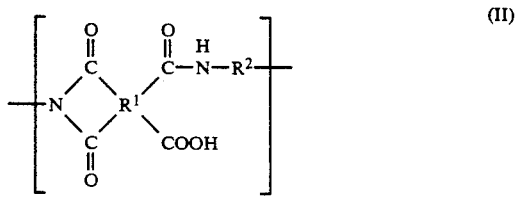

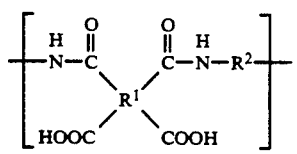

(III)

wherein $R^1$ is a tetravalent organic radical and $R^2$ is a divalent organic radical.

More particularly, $R^1$ preferably denotes independently a carbocyclic-aromatic, heterocyclic, aliphatic or cycloaliphatic radical. When $R^1$ is a carbocyclic-aromatic radical it preferably has at least one 6-membered ring; in particular, these are monocyclic radicals, fused polycyclic radicals or polycyclic radicals with several cyclic, fused or non-fused systems which can be linked to one another directly or via bridge members.

As examples of suitable bridge members there may be mentioned:

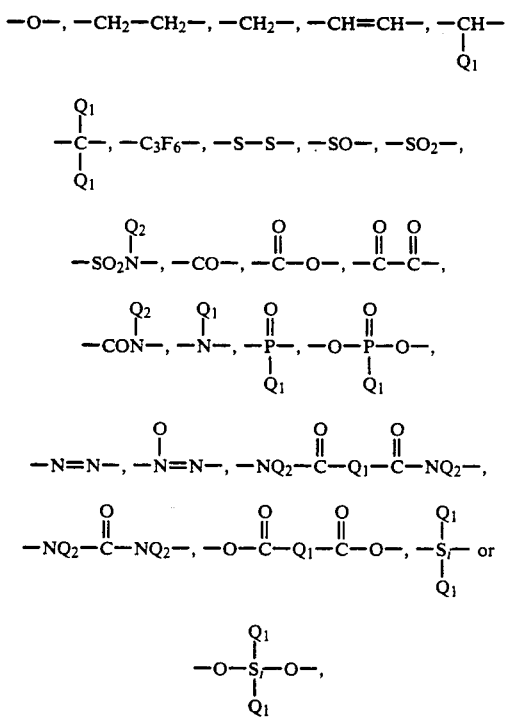

wherein $Q_1$ represents an alkyl or alkylene radical with 1 to 6, preferably 1 to 4, carbon atoms, which can optionally be substituted by at least one halogen atom, preferably fluorine, or a cycloalkyl, aryl or arylene radical and $Q_2$ represents hydrogen, an alkyl radical with 1 to 4 carbon atoms, which can optionally be substituted by halogen atoms, a cycloalkyl radical or an aryl radical. Such radicals can also be bonded to one another via two bridge members, such as two $-SO_2-$ groups.

When $R^1$ is a heterocyclic radical, it can in particular be a 5-membered or 6-membered heterocyclic-aromatic, or benzo-condensed ring system containing O, N and/or S.

Carboxylic-aromatic or heterocyclic radicals represented by $R^1$ can also be substitiuted, for example by one or more (a) nitro groups, (b) alkyl groups with 1 to 4 carbon atoms, (c) trifluoromethyl groups, (d) halogen atoms, and preferably one or more (a) fluorine atoms, (b) silyl groups or (c) sulphamoyl groups.

Preferably, the individual $R^1$ independently of one another represent an unsubstituted monocyclic, fused polycyclic or nonfused bicyclic aromatic radical, the aromatic nuclei in the latter case being bonded to one another via the bridge member $-O-$ or $-CO-$. Possible aliphatic radicals $R^1$ are above all aliphatic radicals with 4 to 12 carbon atoms, and the aliphatic chain can also be interrupted by hetero-atoms, such as O, S, or N atoms.

When $R^1$ denotes a cycloaliphatic radical, it can be for example, a cyclobutyl or cyclohexyl radical.

$R^2$ preferably denotes an aliphatic radical with at least 2 carbon atoms, or a cycloaliphatic, araliphatic, carbocyclicaromatic or heterocyclic radical.

Radicals represented by $R^2$ can be unsubstituted or substituted, for example by one or more (a) halogen atoms, such as fluorine, chlorine or bromine, or (b) or alkoxy groups each with 1 to 4 carbon atoms.

When $R^2$ represents a carbocyclic-aromatic radical, it is preferably a monocyclic, fused polycyclic or non-fused bicyclic aromatic radical, and in the latter case the aromatic nuclei are bonded to one another via a bridge member. Possible bridge members are the groups mentioned previously with regard to $R^1$. When $R^2$ is a heterocyclic radical, it is preferably a heterocyclic-aromatic 5-membered or 6-membered ring containing O, N and/or S.

Possible aliphatic radicals $R^2$ are preferably alkylene radicals with 2 to 12 carbon atoms, and the alkylene chain can also be interrupted by hetero-atoms, such as O, S or N atoms.

When $R^2$ denotes a cycloaliphatic radical it can be, for example, the cyclohexyl or dicyclophexylmethane radical, while possible araliphatic radicals are preferably 1,3-, 1,4- or 2,4-bis-alkylenebenzene, 4,4'-bis-alkylene-diphenyl and 4,4'-bis-alkylene-diphenyl-ether radicals.

The individual $R^2$ preferably independently of one another denote a monocyclic or non-fused bicyclic aromatic radical which is optionally substituted by one or more (a) halogen atoms or (b) alkyl or alkoxy groups with 1 to 4 carbon atoms each, an unsubstituted aliphatic radical possessing 2 to 10 carbon atoms.

(b) the weight ratio of the polyamide-acid (A) to the partially imidized polyamide-acid (B) [(A)/(B)] ranging from 0/1 to 100/1, (c) The total amount of the polyamide-acid and the partially imidized polyamide-acid (B) being 5–50 1 % by weight of the total amount of the polyamide-acid (A), the partially imidized polyamide-acid (B), and the solvent.

DESCRIPTION OF THE PREFERRED EMBODIMENT

The polyamide-acid (A) used in the ink composition of the present invention may be produced by reacting mainly organic tetracarboxylic acid dianhydrides with organic diamines in organic solvents. In addition to the tetracarboxylic acid anhydrides and organic diamines, there may be added a small amount of trimellitic anhydride, dicarboxylic acids, aminocarboxylic acids and the like.

The partially imidized polyamide-acid (B) used in the present invention may be obtained by heating the above-mentioned polyamide-acid (A). That is, first the above-mentioned acid dianhydrides and organic diamines are reacted in organic solvents with stirring usually at 0°-60° C., preperably 5°-40° C. to produce a polyamide-acid solution. The reaction conditions may be optionally changed depending on the composition and the attempted molecular weight. A solution of the martially imidized polyamide-acid (B) may be obtained by heating the above-mentioned polyamide-acid (A) solution at 80°-1500° C. to proceed the partial imidizing. The tetracarboxylic acid dianhydrides used for the production of polyamide-acids may be shown by the following general formula (IV):

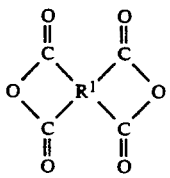

where R¹ is as indicated above.

The compounds of the formula (IV) include particularly, for example, pyromellitic dianhydride, benzene-1,2,3,4-tetracarboxylic acid dianhydride, 2,2′3,3′-benzophenone-tetracarboxylic acid dianhydride, 2,3,3′,4′-benzophenone-tetracarboxylic acid dianhydride, 3,3′,4,4′-benzophenone-tetracarboxylic acid dianhydride, 2,2′,3,3′-biphenyl-tetracarboxylic acid dianhydride, 3,3′,4,4′-biphenyl-tetracarboxylic acid dianhydride, 2,3,3′,4′-biphenyl-tetracarboxylic acid dianhydride, 2,3,6,7-naphthalene-tetracarboxylic acid dianhydride, 3,4,9,10-perylene-tetracarboxylic acid dianhydride, 2,3,6,7-anthracene-tetracarboxylic acid dianhydride, 1,2,7,8-phenanthrene-tetracarboxylic acid dianhydride, bis(2,3-dicarboxyphenyl)methane dianhydride, bis(3,4-dicarboxyphenyl)methane dianhydride, 1,2,5,6-naphthalene-tetracarboxylic acid dianhydride, 2,2-bis(2,3-dicarboxyphenyl)propane dianhydride, 2,2-bis(3,4-dicarboxyphenyl)propane dianhydride, 1,1-bis(2,3-dicarboxyphenyl)ethane dianhydride, bis(3,4-dicarboxyphenyl)sulfone dianhydride, bis(3,4-dicarboxyphenyl)ether dianhydride, 3,3′,4,4′-tetracarboxybenzoyloxybenzene dianhydride, N,N-(3,4-dicarboxyphenyl)N-methylamine dianhydride, thiophene-2,3,4,5-tetracarboxylic acid dianhydride, pyrazine-2,3,5,6-tetracarboxylic acid dianhydride, pyridine-2,3,5,6-tetracarboxylic acid dianhydride, 1,2,3,4-butane-tetracarboxylic acid dianhydride, pentane-tetracarboxylic acid dianhydride, hexane-tetracarboxylic acid dianhydride, 1,2,3,4-cyclopentanetetracarboxylic acid dianhydride, 1,2,3,4-bicyclohexene-tetracarboxylic acid dianhydride, 1,2,3,4-tetrahydrofuran-tetracarboxylic acid dianhydride, 1,2,3,4-cyclobutane-tetracarboxylic acid dianhydride, 2,3,5-tricarboxycyclopentylacetic acid dianhydride, and the like.

These compounds may be used alone or in combination. Diamines which may be used in the present invention for producing the polyamide-acid are shown by the following formula (V),

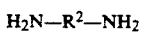

where R² is as indicated above.

The compounds of formula (V) include carbocyclicaromatic diamines, heterocyclic diamines, aliphatic diamines, cycloaliphatic diamines arylaliphatic diamines and the like.

Exemplary suitable carbocyclic-aromatic diamines include o-, m- and p- phenylenediamines, diaminotoluenes (e.g. 2,4-diaminotoluene), 1,4-diamino-2-methoxybenzene, 2,5-diaminoxylenes, 1,3-diamino-4-chlorobenzene, 1,4-diamino-2,5-dichlorobenzene, 1,4-diamino-2-bromobenzene, 1,3-diamino-4-isopropylbenzene, N,N-diphenyl-1,4-phenylenediamine, 4,4′-diaminophenyl-2,2-propane, 4,4′-diaminodiphenylmethane, 2,2′-diaminostilbene, 4,4′-diaminostilbene, 4,4′-diaminodiphenyl ether, 4,4′-diaminodiphenyl-thioether, 4,4′-diaminodiphenyl sulfone, 3,3′-diaminodiphenyl sulfone, 4,4′-diaminobenzoic acid phenyl ester, 2,2′-diaminobenzophenone, 4,4′-diaminobenzophenone, 4,4′-diaminobenzil, 4-(4′-aminophenylcarbamoyl)-aniline, bis(4-aminophenyl)-phosphine oxide, bis(4-aminophenyl)methyl-phosphine oxide, bis(3-aminophenyl)-methylsulfine oxide, bis(4-aminophenyl)-phenylphosphine oxide, bis(4-aminophenyl)-cyclohexylphosphine oxide, N,N-bis(4-aminophenyl)-N-phenylamine, N,N-bis(4-aminophenyl)-N-methylamine, 4,4′-diaminodiphenyl urea, 1,8-diaminonaphthalene, 1,5-diaminonaphthalene, 1,5-diaminoanthraquinone, diaminofluoranthene, bis(4-aminophenyl)-diethylsilane, bis(4-aminophenyl)-dimethylsilane, and bis(4-aminonhenyl)-tetramethyl-disiloxane.

Among the above-mentioned carbocyclic-aromatic diamines, 1,4-phenylenediamine, 1,3-phenylenediamine, 4,4′-diaminodiphenyl ether and 4,4′-diaminodiphenyl methane are preferable.

Exemplary suitable heterocyclic diamines include 2,6-diaminopyridine, 2,4-diaminopyrimidine, 2,4-diamino-s-triazine, 2,7-diamino-dibenzofuran, 2,7-diaminocarbazole, 3,7-diaminophenothiazine, and 2,5-diamino-1,3,4-thiadiazole.

Exemplary suitable aliphatic diamines include dimethylenediamine, trimethylenediamine, tetramethylenediamine, hexamethylenediamine, heptamethylenediamine, octamethylenediamine, nonamethylenediamine, decamethylenediamine, 2,2-dimethylpropylenediamine, 2,5-dimethylhexamethylenediamine, 2,5-dimethylheptamethylenediamine, 4,4-dimethylheptamethylenediamine, 3-methylheptamethylenediamine, 3-methoxyhexamethylenediamine, 5-methylnonamethylenediamine, 2,11-diaminododecane, 1,12-diaminooctadecane, 1,2-bis(3-aminopropoxy)-ethane, N,N′-dimethylethylenediamine, N,N′-diethyl-1,3-diaminopropane, N,N′-dimethyl-1,6-diaminohexane, diamine of the formula:

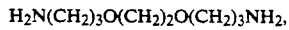

and diamine of the formula:

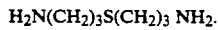

Exemplary suitable cycloaliphatic diamines include 1,4-diaminocyclohexane and 4,4′-diamino-dicyclohexylmethane.

Exemplary suitable arlaliphatic diamines include 1,4-bis(2-methyl-4-aminopentyl)-benzene, 1,4-bis(1,1-dimethyl-5-aminopentyl)-benzene, 1,3-bis(aminomethyl)benzene and 1,4-bis(aminomethyl)-benzene.

These diamines may be used alone or in combination. It is desirable to select a combination of the above-mentioned acid dianhydrides and the diamines depending on characteristics of the substrate resin layer.

The reaction of tetracarboxylic acid dianhydride with diamines is usually effected in the presence of organic solvents. The solvents used in the reaction include N,N-dimethylformamide, N,N-diethylformamide, N-methyl-2-pyrrolidone, N,N-dimethylacetamide, N-methylcaprolactam, dimethylsulfoxide, hexamethylphosphoramide, tetramethylenesulfone, tetramethylurea, γ-butyrolactone, N-acetyl-2-pyrrolidone, phenol, cresols, nitro compounds, chlorine series solvents such as chloroform, enethylene chloride and the like, cellusolves, carbitols and the like. If desired, a widely used solvent such as benzene, toluene, xylene and the like may be added to these solvents. The amount of the organic solvent used is preferably such that the concentration of solid matter in the reaction system ranges from 5 to 50% by weight, and further it is preferred that the viscosity is adjusted to 500-500,000 c.p.

The reaction to produce polyamide-acids is an exothermic reaction and therefore it is desired to control the reaction by cooling if necessary. A tetracarboxylic acid dianhydride and a diamine may be simultaneously added to the organic solvent, or one of them may be suspended or dissolved in the organic solvent and then the other is gradually added thereto to proceed the reaction and this procedure is also preferred.

The molar ratio of the both components is preferably equimolar ratio, but one of them may be used in excess without any problem as long as the molar ratio ranges from 10:9 to 9:10.

A solution of the partially imidized polyamide-acid (B) may be produced by heating the solution of the polyamide-acid (A) as obtained above. The imidizing reaction is a dehydrating reaction and it is desired that the resulting water is positively removed by adding to the reaction system a solvent capable of forming an azeotropic mixture with water such as toluene, benzene and the like. These solvents are added preferably after completion of the polyamide-acid synthetic reaction. The partially imidizing reaction is effected preferably by heating a molyamide-acid at 80°-150° C. with stirring.

The imidizing rate T of the partially imidized polyamide-acid (B) of the present invention is defined by the following formula (IV)

$$T = \frac{(2C + D) \times 100}{2(C + D + E)} \quad (IV)$$

The imidizing rate T of the partially imidized polyamide-acid is preferably 15-85. When T is less than 15, the thixotropy is small and running of ink occurs after printing and it is difficult to form exact patterns. When T is larger than 85, the thixotropy becomes too high and the ink becomes a gel-like state so that the printing is difficult and the resin is separated from the solvent.

The resulting polyamide-acid solution and partially imidized polyamide-acid solution can be directly used as a printing ink composition of the present invention. Alternatively, those solutions are mixed with a solvent, or before or after mixing them, a solvent is removed to form a printing ink composition of the present invention.

The amount of the polyamide-acid and the partially imidized polyamide-acid is preferably 5-50% by weight of the total amount of these two and a solvent.

The thixotrony is a phenomenon caused by the partial imidizing of polyamide-acid and therefore it is possible to prepare a printing ink composition exhibiting thixotropy without adding any thixotropy agent.

The thixotropy ratio is defined as a ratio of the viscosity at 0.5 rpm to that at 5 rpm when the viscosity of the ink is measured by a rotating viscometer at 25° C.

The thixotropy ratio can be optionally controlled by controlling the heating time or the reaction temperature in the partial imidizing reaction of the above-mentioned polyamide-acid, or by varying the mixing ratio of the polyamide-acid (A) to the partially imidized polyamide-acid. The thixotropy ratio of ink composition of the present invention is preferably 1.1-15. Therefore, the weight ratio of the polyamide-acid (A) to the partially imidized polyamide-acid (B) [(A)/(B)] is 0/1-100/1, preferably 1/10-100/1. When the weight ratio is larger than 100/1, the thixotropy ratio becomes too small and running of ink occurs after printing so that it is liable to be difficult to form an exact pattern.

It is preferred that the printing ink composition of the present invention contains a defoaming agent. Silicon type defoaming agents are preferable. When the printing ink composition contains a defoaming agent, the amount of the defoaming agent is usually 0.1-10 parts by weight, preferably 0.5-5 parts by weight per 100 parts of the total amount of the polyamide-acid (A), the partially imidized polyamide-acid (B) and the solvent. When the amount is less than 0.1 part by weight, much foam often forms upon printing. In a certain case the foam does not disappear while in other case the foam disappears as a time lapses during standing. However, when the standing time required for disappearing of foam is long, the operation efficiency is remarkably lowered, and after dry-curing, pinholes in the film surface and non-uniform thickness of the film are liable to occur.

On the contrary, when the amount is larger than 10 parts by weight, sometimes the defoaming agent oozes out to the surface of the film to make the surface sticky, lower the adhesion between the film and the substrate, cause repelling on the printing surface and separate resins from the defoaming agent resulting in a non-uniform state.

The printing ink composition of the present invention can be produced according to a conventional procedure by subjecting a mixture of the above-mentioned polyamide-acid, partially imidized polyamide-acid, a solvent and the like to an ink-mill constituted of three rolls to form into an ink, and is a kind of one-liquid type ink compositions having good storage stability.

The method of using the printing ink composition of the present invention comprises, for example, first coating the printing ink composition on a circuit board by screen printing or mask printing. Then the resulting coated film is dried at 100°-140° C. for 10-30 min. in a hot-air drying oven and heat-cured further at 200°-300° C. for 10-30 min.

Thus, a circuit board having a coating layer and free from curl can be obtained.

The resulting coating layer has the following characteristics, i.e. solder heat-resistance is that no change is observed even after 60 sec. or more at 300° C. of soaking. With respect to flexibility, the bending resistance of a board having the coating layer is at least 3 times that of a board having no coating layer when the bending resistance is measured according to the MIT-type bending resistance test under the conditions: a radius of curvature of 0.38 mm; a bending angle to a fore direction of 135° and 270° in total of the fore-and-back bending per one time bending, and a bending speed of 180 times per min. ; and a load of 500 g.

As is clear from above, the printing ink composition of the present invention is excellent in heat-resistance, adhesion, flexibility, and electric properties. The composition can be coated on a flexible copper-coated board by a screen printing method, and thereby a highly reliable film can be easily formed. Therefore, a complicated work such as adhering of a cover film is not necessary so that the production efficiency is improved and further, only printing and heat-drying are necessary so that expensive equipments such as roll press and the like are not necessary.

The present invention is explained further in detail by the following examples and comparative examples, but the present invention is by no means limited to them.

in the following, part and parts are by weight unless otherwise specified.

EXAMPLE 1

(1) [Preparation of Polyamide-acid]

2 1. four-necked separable flask equipped with a stirrer, thermometer and nitrogen replacing device was fixed on a water both. 1300 ml. of N-methyl-2-pyrrolidone (hereinafter referred to as "NMP") distilled under reduced pressure was added to the flask in a nitrogen atmosphere. Then 44.71 g (413.5 m mol) of p-phenylenediamine (hereinafter referred to as "p-PDA") and 20.70 g (103.4 m mol) of 4,4'-diaminodiphenyl ether (hereinafter referred to as "4,4'-DDE") were fed to the flask and suspended in NMP.

Further, 152.07 g (516.8 m mol) of 3,3', 4,4'-biphenyl-tetracarboxylic acid dianhydride (hereinafter referred to as "s-BPDA" was gradually added thereto. The reaction system was kept at 300° C. or lower with stirring until the reaction mass became a transparent viscous liquid.

(2) [Preparation of Partially Imidized Polyamide-acid]

To a part of the polyamide-acid solution obtained in (1) above was added 100 ml of benzene and the temperature was elevated to 120° C. and kept at this temperature for 50 min. to carry out reaction. Then the benzene was distilled off and the resulting solution was stirred until it became a transparent, yellow, viscous liquid exhibiting thixotropy. Imidizing rate of the resulting partially imidized polyamide-acid is shown in Table 1.

(3) [Preparation of Printing Ink]

A polyamide-acid solution obtained according to (1), a partially imidized polyamide-acid solution obtained according to (2), NMP, and a defoaming agent (Antifoam DB - 100, tradename, manufactured by Dow Corning Co. Ltd) were mixed at a mixing ratio as shown in Table 2 and kneaded three times by a three-roll mill to obtain paste-like printing ink compositions (a-1) and (a-2). Rotating viscosity of the ink composion (a) was measured with an E-type viscometer: rotater 3° X R14 (hereinafter, the same is applicable) at 0.5 rpm and 5 rpm. The results of the measurement and thixotropy ratio are shown in Table 2.

EXAMPLE 2

(1) [Preparation of Polyamide-acid]

A polyamide-acid was prepared following the procedure of Example 1 (1).

(2) [Preparation of Partially Imidized Polyamide-acid]

Following the procedure of Example 1 (2), partially imidized polyamide-acid was obtained. Imidizing rate of the partially imidized polyamide-acid is shown in Table 1.

(3) [Preparation of Printing Ink Composition]

Following the procedure of Example 1 (3), a polyamide-acid solution, a partially imidized polyamide-acid solution, NMP and a defoaming agent were mixed at an amount ratio shown in Table 2 and kneaded three times with a three-roll mill to obtain a paste-like printing ink composition (b).

The rotating viscosity of the resulting composition and its thixotropy ratio are shown in Table 2.

EXAMPLE 3

(1) [Preparation of Polyamide-acid]

Repeating the procedure of Example 1 (1) except that the composition of diamine was changed as shown in Table 1, a polyamide-acid was prepared.

(2) [Preparation of Partially imidized Polyamide-acid]

Repeating the procedure of Example 1 (2) except that the time of keeping the temperature at 120° C. was changed, the preparation was carried out. The imidizing rate of the polyamide-acid thus partially imidized is shown in Table 1.

(3) [Preparation of Printing Ink Composition]

Following the procedure of Example 1 (3), a polyamide-acid solution, a partially imidized polyamide-acid solution, NMP and a defoaming agent were mixed at the ratio as shown in Table 2, and kneaded three times by a three-roll mill to obtain a paste-like printing ink composition (c). Rotating viscosity and thixotropy of the composition are shown in Table 2.

EXAMPLE 4

(1) [Preparation of Polyamide-acid]

Following the procedure of Example 3 (1), a polyamide was prepared.

(2) [Preparation of Partially Imidized Polyamide-acid]

Repeating the procedure of Example 3 (2), a partially imidized polyamide-acid was prepared. The imidizing rate of the resulting partially imidized polyamide-acid is shown in Table 1.

(3) [Preparation of Printing Ink Composition]

Following the procedure of Example 3 (3), a polyamide-acid solution, a partially 5-imidized polyamide-acid solution, NMP and a defoaming agent %,7ere mixed at a ratio as shown in Table 2 and kneaded three times by a three-roll mill to obtain a paste-like printing ink composition (d). Rotating viscosity and thixotropy ratio are shown in Table 2.

COMPARATIVE EXAMPLE 1

(1) [Preparation of Polyamide-acid]

Following the procedure of Example 1 (1), a polyamide-acid was prepared.

(2) [Preparation of Printing Ink Composition]

The polyamide-acid solution obtained in (1) above, Aerosil 200 (tradename, manufactured by Japan Aerosil Co. Ltd.), NMP and a defoaming agent as used in Example 1 were mixed at a ratio as shown in Table 2 and kneaded three times by a three-roll mill to obtain a paste-like printing ink composition (e). Rotating viscosity and thixotropy ratio of the resulting ink composition (e) are shown in Table 2.

coating at 100° C. for 10 min. and then at 300° C. for 10 min. Running width of pattern, pattern precision, surface smoothness, curling, film thickness, and operation property of the resulting film are shown in Table 3.

TABLE 1

|  | Acid anhydride component (Molar ratio) | Diamine components (Molar ratio) | Solvent | Concentration of raw material (% by weight) | Time for keeping imidizing (min.) | Imidizing rate* |
| --- | --- | --- | --- | --- | --- | --- |
| Example 1 | s-BPDA(1) | p-PDA(0.8) 4,4'-DDE(0.2) | NMP | 20 | 50 | 40 |
| Example 2 | s-BPDA(1) | p-PDA(0.8) 4,4'-DDE(0.2) | NMP | 20 | 50 | 40 |
| Example 3 | s-BPDA(1) | p-PDA(0.9) 4,4'-DDE(0.1) | NMP | 20 | 40 | 48 |
| Example 4 | s-BPDA(1) | p-PDA(0.9) 4,4'-DDE(0.1) | NMP | 20 | 40 | 48 |
| Comparative Example 1 | s-BPDA(1) | p-PDA(0.8) 4,4'-DDE(0.2) | NMP | 20 | — | — |
| Comparative Example 2 | s-BPDA(1) | p-PDA(0.8) 4,4'-DDE(0.2) | NMP | 20 | — | — |

*The imidizing rate was determined by the ratio of the absorption at 1790 cm$^{-1}$ (imido group) to that at 1520 cm$^{-1}$ (aromatic group) using the infrared absorption spectrum by a KBr tablet method.

TABLE 2

|  | Ratio of Components (parts) | | | | | | Viscosity 0.5 rpm (c.p.) | Viscosity 0.5 rpm (c.p.) | Thixotropy ratio [Viscosity (0.5 rpm)/ Viscosity (5 rpm)] |
| --- | --- | --- | --- | --- | --- | --- | --- | --- | --- |
|  | Polyamide-acid (A) solution | Partially imidized polyamide-acid (B) solution | Defoaming agent | NMP | Aerosil 200 | Aerosil RY 200 | | | |
| Example 1-1 | 75 | 100 | 6 | 25 | 0 | 0 | 70,000 | 21,000 | 3.3 |
| Example 1-2 | 0 | 100 | 3 | 25 | 0 | 0 | 120,000 | 14,000 | 8.6 |
| Example 2 | 75 | 200 | 9 | 25 | 0 | 0 | 46,000 | 23,000 | 2.0 |
| Example 3 | 75 | 100 | 6 | 25 | 0 | 0 | 86,000 | 25,000 | 3.4 |
| Example 4 | 75 | 200 | 9 | 25 | 0 | 0 | 55,000 | 27,000 | 2.0 |
| Comparative Example 1 | 75 | 0 | 3 | 25 | 3 | 0 | 130,000 | 95,000 | 1.4 |
| Comparative Example 2 | 75 | 0 | 3 | 25 | 0 | 3 | 200,000 | 100,000 | 2.0 |

TABLE 3

|  | Ink | Running width (μm) | Pattern precision (μm) | Surface smoothness (Observation with eye) | Curling | Thickness of film (μm) | Operation property |
| --- | --- | --- | --- | --- | --- | --- | --- |
| Example 1-1 | (a-1) | <100 | <200 | good | none | 26 | good |
| Example 1-2 | (a-2) | <100 | <200 | fairly good | none | 26 | good |
| Example 2 | (b) | <100 | <200 | good | none | 26 | good |
| Example 3 | (c) | <100 | <200 | good | none | 26 | good |
| Example 4 | (d) | <100 | <200 | good | none | 26 | good |
| Comparative Example 1 | (e) | 150 | 300 | good | none | 27 | good |
| Comparative Example 2 | (f) | <100 | <200 | good | none | 27 | good |

COMPARATIVE EXAMPLE 2

(1) [Preparation of Polyamide-acid]

Following the procedure of Example 1 (1), a polyamide-acid was prepared.

(2) [Preparation of Printing Ink Composition]

The polyamide-acid solution as obtained in (1) above, Aerosil RY 200 (tradename, manufactured by Japan Aerosil Co. Ltd.), NMP and the defoaming agent as used in Example 1were mixed at a ratio shown in Table 2 and kneaded three times by a three-roil mail to obtain a paste-like printing ink composition (f). Rotating viscosity and thixotropy of the resulting ink composition (f) are shown in Table 2.

These inks (a-1)–(f) were printed on a flexible copper-coated board (Thickness of polyimide base: 60 μm) by a screen printing method using a 80 mesh screen. Then, a heat treatment was effected at 100° C. for 10 min. Further, the printing was effected on the previously printed In Table 3, what is meant by "operation property, good" is that foaming, repelling, blotting, blurring and thread forming of ink do not occur upon printing.

In addition, characteristics, in particular, flexibility, heat resistance, and electric property of the resulting flexible copper-coated board were measured and the results are shown in Table 4. The above-mentioned "flexibility" is shown in terms of a ratio of the number of bending required for breakdown of a flexible copper-coated board having a film to that of a flexible copper-coated board having no film, and is given for indicating how much the bending resistance of the former is improved as compared with that of the latter.

The measuring conditions were that a MIT-type bending test machine was used with a bending speed of 180 times/min., a tension of 500 gf, a radius of curvature of 0.38 mm and the number of bending when electric conduction of the circuit was broken down was measured. The pattern of conductor was one going-and-returning circuit having a conductor width of 1.5 mm and a gap of 1.0 mm produced by etching.

The heat resistance was evaluated by eye-observation of peeling, bulging and discoloration of the film when the board was floated in a solder bath at 300° C. for 60 sec. A board where no change was observed before and after the test was evaluated to be good.

The adhesion was evaluated according to JIS K 5400 based on the evaluation standard of Foundation, Nippon Tosoh Gijitsu Kyokai (Japan Coating Technique Society). That is, an area of 1 cm square was divided crosswise by lines at intervals of 1 mm. and along the lines the film only was cut so that 100 pieces of a small area of 1 mm square might be formed while the substrate was not cut. Then a cellophane adhesive tape was adhered to the film area thus cut and then pulled up at an angle of 90 degrees and evaluation was made based on the number of the small area of 1 mm square peeled off. A board where none of the small area was peeled off and each small area had no deficiency was given 10 points, full marks.

The electric property was shown in terms of an electric insulating resistance between lines after one minute of application of DC 100 V to a parallel pattern of line gap of 1.0 mm and total length of 80 mm produced by etching, according to JIS C 6481.

TABLE 4

|  | Ink | Flexibility (times) | Heat Resistance | Adhesion | Electric property (Ω) |
|---|---|---|---|---|---|
| Example 1-1 | (a-1) | 3.3 | No damage | 10 | $7 \times 10^{12}$ |
| Example 1-2 | (a-2) | 3.3 | " | 10 | $7 \times 10^{12}$ |
| Example 2 | (b) | 3.3 | " | 10 | $7 \times 10^{12}$ |
| Example 3 | (c) | 3.2 | " | 10 | $6 \times 10^{12}$ |
| Example 4 | (d) | 3.1 | " | 10 | $5 \times 10^{12}$ |
| Comparative Example 1 | (e) | 1.1 | " | 10 | $3 \times 10^{12}$ |
| Comparative Example 2 | (f) | 1.0 | " | 0 | $3 \times 10^{12}$ |

As is clear from Table 3 and Table 4 as mentioned above, each ink of Examples of the present invention shows good physical properties while the ink of Comparative Example 1 is poor at flexibility and printing property and the ink of Comparative Example 2 is poor at flexibility and adhesion to the substrate.

What is claimed is:
1. A method for producing circuit boards with a film having improved printing properties, adhesion, flexibility and heat resistance which comprises
   (1) preparing a liquid printing ink composition from an admixture of a solvent, a polyamide-acid (A), and a partially imidized polyamide-acid (B) containing repeating units of the following formulas (I), (II) and (III),

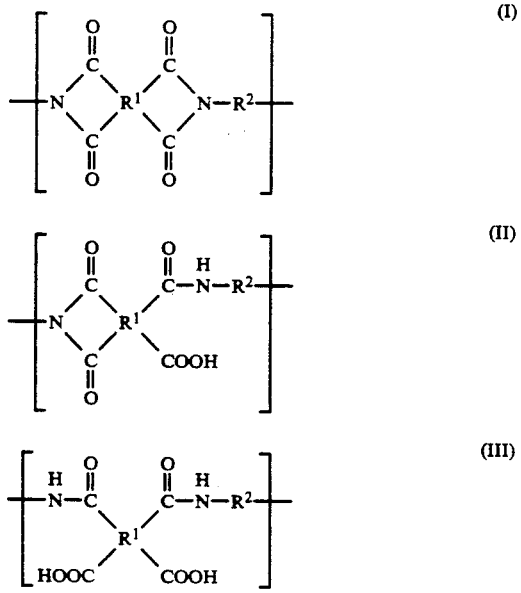

wherein $R^1$ is a tetravalent organic group and R2 is a divalent organic group,
   (a) the weight ratio of (A) to (B) ranges from 1:10 to 100:1, and
   (b) the total amount of the polyamide-acid (A) and the partially imidized polyamide-acid (B) being 5-50% of the entire composition,
   (2) applying said liquid composition containing a mixture of said solvent, a polyamide-acid (A) and said partially imidized polyamide-acid (B) to the circuit board,
   (3) heating said film coated circuit board to effect drying and curing of said film.
2. The method of claim 1 wherein said partially imidized polyamide-acid has an imidizing rate of 15-85, said imidizing rate being defined by the following formula $$T = \frac{(2C + D) \times 100}{2(C + D + E)}$$

where C, D and E are molar amounts of said repeating units (I), (II) and (III), respectively.
3. The method according to claim 1 wherein the composition additionally contains a defoaming agent.
4. The method according to claim 3 in which the amount of the defoaming agent in the composition is 0.1-10 parts by weight per 100 parts of the entire composition.
5. The method according to claim 1 in which said liquid composition has a thixotropy ratio which ranges from 1.1 to 15.

* * * * *